United States Patent

Schmiegel

(10) Patent No.: US 9,722,282 B2
(45) Date of Patent: Aug. 1, 2017

(54) METHOD AND DEVICE FOR SETTING A MAXIMUM DEPTH OF DISCHARGE OF AN ENERGY STORE FOR A TIME PERIOD

(71) Applicant: Robert Bosch GmbH, Stuttgart (DE)

(72) Inventor: Armin Uwe Schmiegel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/029,557

(22) PCT Filed: Oct. 6, 2014

(86) PCT No.: PCT/EP2014/071361
§ 371 (c)(1),
(2) Date: Aug. 24, 2016

(87) PCT Pub. No.: WO2015/055454
PCT Pub. Date: Apr. 23, 2015

(65) Prior Publication Data
US 2016/0359203 A1     Dec. 8, 2016

(30) Foreign Application Priority Data
Oct. 18, 2013  (DE) .................... 10 2013 221 192

(51) Int. Cl.
| H01M 10/44 | (2006.01) |
| G01R 31/36 | (2006.01) |
| H02J 7/00  | (2006.01) |

(52) U.S. Cl.
CPC ........ *H01M 10/44* (2013.01); *G01R 31/3679* (2013.01); *H02J 7/0029* (2013.01); *H02J 2007/004* (2013.01)

(58) Field of Classification Search
CPC .......... H02J 7/0052; H02J 7/00; H02J 7/0029; H02J 2007/004; G01R 31/36;
(Continued)

(56) References Cited

U.S. PATENT DOCUMENTS

| 2004/0090195 A1* | 5/2004 | Motsenbocker ........ B63B 43/18 318/109 |
| 2004/0128089 A1* | 7/2004 | Barsoukov ......... G01R 31/3662 702/65 |

(Continued)

FOREIGN PATENT DOCUMENTS

| DE | 102007038586 A1 | 2/2009 |
| WO | 2011035837 A1 | 3/2011 |

OTHER PUBLICATIONS

International Search Report dated Jan. 22, 2015 for International Application No. PCT/EP2014/071361.

*Primary Examiner* — Richard Isla Rodas
*Assistant Examiner* — Dung V Bui
(74) *Attorney, Agent, or Firm* — Norton Rose Fulbright US LLP; Gerard Messina

(57) ABSTRACT

A method and apparatus for setting a maximum depth of discharge of an energy reservoir for a time period. The method includes: defining a first target aging value of the energy reservoir for a first time period; determining a first aging value that describes an aging of the energy reservoir during the first period; calculating a first difference between the first target aging value of the energy reservoir and the first aging value of the energy reservoir; defining a second target aging value of the energy reservoir for a second time period; calculating a maximum aging value of the energy reservoir for the second time period, based on the second target aging value and at least the first difference; calculating a maximum depth-of-discharge value based on the maximum aging value; setting the maximum depth of discharge of the energy reservoir for the second time period to the maximum depth-of-discharge value.

9 Claims, 2 Drawing Sheets

(58) Field of Classification Search
CPC ....... G01R 31/3679; G06F 19/00; H02P 5/46;
G01N 27/416; G01N 27/02; H01M 4/58;
H01M 10/44
USPC ........ 320/136, 132, 139, 155, 160; 318/109;
324/426, 427, 439; 429/231.95; 702/63,
702/65
See application file for complete search history.

(56) References Cited

U.S. PATENT DOCUMENTS

| | | | |
|---|---|---|---|
| 2005/0052158 A1* | 3/2005 | Meissner | G01R 31/3679 320/132 |
| 2007/0166617 A1* | 7/2007 | Gozdz | H01M 4/133 429/231.95 |
| 2009/0027056 A1* | 1/2009 | Huang | B60L 11/1857 324/439 |
| 2013/0066573 A1* | 3/2013 | Bond | G01R 31/3679 702/63 |

\* cited by examiner

METHOD AND DEVICE FOR SETTING A MAXIMUM DEPTH OF DISCHARGE OF AN ENERGY STORE FOR A TIME PERIOD

FIELD OF THE INVENTION

The present invention relates to a method and an apparatus for setting a maximum depth of discharge of an energy reservoir, in particular of a battery, for a time period.

BACKGROUND INFORMATION

Energy reservoirs, in particular rechargeable batteries having a long service life during which they can furnish electrical power, are required in numerous applications. The service life of a battery is limited essentially by two effects: calendrical aging of the battery, and cyclic aging of the battery. Calendrical aging of the battery is greatly influenced by the average state of charge (SOC). Cyclic aging of the battery is based on the regular charging and discharging of the battery. An essential determining variable for cyclic aging is the depth of discharge (DOD).

A battery may be configured so that a specific service life is achieved in the context of an average depth of discharge or a characteristic charging and discharging profile. The "service life" is defined, for example, as the time at which the battery has lost 20% of its original (energy storage) capacity. Certain safety margins are often also implemented, intended to ensure that the service life is in fact attained.

Aging models that characterize aging of the battery are used in connection with the service life. As a battery's age increases, its "state of health" SOH decreases. The state of health SOH is usually defined as a number between 1 (beginning of the battery's service life) and 0 (end of the battery's service life).

Patent document DE 10 2007 038 586 A1 discusses a method for service life monitoring and optimum utilization of a battery of a hybrid vehicle. Here the battery is stressed within dynamically predefined stress limits, these stress limits being calculated as a function of state and of the previous utilization of the battery. The calculation is based on a stress index that is ascertained on the basis of utilization of the battery's state of charge, the battery temperature, the battery voltage, and/or the voltage of individual cells of the battery.

SUMMARY OF THE INVENTION

The present invention discloses a method having the features described herein and an apparatus having the features described herein.

In accordance therewith a method for setting a maximum depth of discharge of an energy reservoir for a time period is provided, having the steps of: defining a first target aging value of the energy reservoir for a first time period; determining a first aging value that describes an aging of the energy reservoir during the first time period; calculating a first difference between the first target aging value of the energy reservoir and the first aging value of the energy reservoir; defining a second target aging value of the energy reservoir for a second time period; calculating a maximum aging value of the energy reservoir for the second time period, based on the second target aging value and at least the first difference; calculating a maximum depth-of-discharge value based on the maximum aging value; setting the maximum depth of discharge of the energy reservoir for the second time period to the maximum depth-of-discharge value.

Also provided is an apparatus for setting a maximum depth of discharge of an energy reservoir for a time period, having a defining device for defining a first target aging value of the energy reservoir for a first time period and for defining a second target aging value of the energy reservoir for a second time period. The apparatus furthermore encompasses an aging value determining device for determining a first aging value that describes an aging of the energy reservoir during the first time period. The apparatus furthermore has a calculation device for calculating a first difference between the first target aging value of the energy reservoir and the first aging value of the energy reservoir, for calculating a maximum aging value of the energy reservoir for the second time period based on the second target aging value and at least the first difference, and for calculating a maximum depth-of-discharge value based on the maximum aging value. The apparatus moreover encompasses a setting device for setting the maximum depth of discharge of the energy reservoir for the second time period to the maximum depth-of-discharge value.

The realization on which the present invention is based is that in a specific time period of the service life of an energy reservoir, an actual aging value of the energy reservoir can be less than a target aging value of the energy reservoir for that time period.

Both the target aging value and the actual aging value of the energy reservoir can be calculated based on an aging model for the energy reservoir. For a specific intended service life of the energy reservoir, according to the aging model a target aging value can be ascertained for individual time periods. If the energy reservoir ages during each time period in accordance with the target aging value for that time period, then after the end of the predetermined service life of the energy reservoir the state of health SOH of the energy reservoir can be equal to zero.

In real applications, however, it will very often be the case that in a specific time period the energy reservoir ages less than would correspond to the target aging value for that time period. On the one hand the total service life of the energy reservoir can thereby be extended; but if utilization of the energy reservoir only up to the predetermined service life is planned, the fact that the aging of the energy reservoir is less than the target aging value in various time periods means that potential is wasted. In other words, the energy reservoir is not being optimally utilized, so that at the end of the planned service life the state of health SOH of the energy reservoir is not equal to zero. In this case the energy reservoir has therefore been utilized less than would have been possible.

The idea on which the present invention is based is to take this realization into account and to set a maximum depth of discharge of the energy reservoir for a time period. The maximum depth of discharge that is set takes into consideration the fact that in some or all time periods, or even only in the immediately preceding time period, the actual aging of the energy reservoir as a rule does not correspond to the target aging value for the time period(s).

According to the present invention the energy reservoir is controlled in a manner adapted dynamically to the actual circumstances and parameters of the energy reservoir, in order to optimize return over the service life of the energy reservoir. A total energy throughput achieved over the planned service life of the battery can thereby be increased. This in turn allows comparatively smaller energy reservoirs to be configured for the same desired total energy throughput. With the method according to the present invention it is also possible to set a maximum depth of discharge dynamically for each time period in the service life of the energy reservoir.

The energy reservoir can be a battery, for example a battery for storing electrical energy generated by way of renewable energy, or a battery in an electric or hybrid vehicle. The energy reservoir can also, however, be, for example, a water reservoir of a pumped-storage power plant.

The apparatus according to the present invention can be embodied, for example, in or on a battery charge controller of a battery constituting an energy reservoir. "Setting the maximum depth of discharge of the battery for a specific time period to a maximum depth-of-discharge value" means in this case that the battery charge controller is allowed to discharge the battery within the second time period only to that maximum depth-of-discharge value. If the battery is already discharged to that value, the battery charge controller prevents further energy withdrawal from the battery before it is has been (at least partly) recharged.

Advantageous embodiments and refinements are evident from the dependent claims and from the description with reference to the Figures.

According to a refinement of the method according to the present invention the first target aging value $a_{targ,1}$ and the second target aging value $a_{targ,2}$ are equal to a constant global target aging value $a_{targ}$. The target aging value can also be the same for every time period during the service life of the battery, and can correspond to the global target aging value $a_{targ}$. The global target aging value $a_{targ}$ can be based, for example, on the nature of the energy reservoir and/or on its installation location, or on a desired target variable, for example a planned service life, a planned total number of cycles, and/or a planned total energy throughput.

According to a further refinement the first target aging value $a_{targ,1}$ and/or the second target aging value $a_{targ,2}$ can be regularly set or modified based on a calendar date. For example, greater depths of discharge (DOD) can be allowed in summer than in winter, for example if the energy reservoir is provided for the storage of energy that is generated based on solar energy. The storage demand of such energy reservoirs is usually greater in summer than in winter, since there are more hours of sunlight per day. Target aging values for time periods on calendar dates on which statistically more hours of sunlight occur per day can correspondingly be set higher than target aging values for time periods on calendar dates on which statistically fewer hours of sunlight occur.

Other external variables can also play a part in defining the variable or constant target aging values, for example an ambient temperature, a rain probability, or a relative humidity at a specific location, depending on the energy reservoir being used and depending on the loads or energy generators connected to the energy reservoir, for example solar, wind, or hydroelectric power plants.

The target aging values $a_{targ,1}$ and $a_{targ,2}$ can also be defined on the basis of time- and location-dependent weather forecasts. For example, if a weather forecast for the installation location of a solar cell facility having a connected energy reservoir predicts particularly high insolation for a specific time span, target aging values for time periods within that specific time span can be higher than target aging values for time periods within time spans with less insolation.

The target aging values $a_{targ,1}$, $a_{targ,2}$ can also be defined based on internalized modeling. For example, a determination can be made by way of a sensor suite that time spans with more energy demand or storage demand, and time spans with less energy demand or storage demand, occur in a specific pattern. Such patterns can occur, for example, with a daily, weekly, monthly, or annual rhythm. If the pattern repeats with a specific minimum reliability, the target aging values for the time periods can be defined in accordance with the pattern that is determined.

According to a further refinement the method encompasses the step of: determining a respective depth of discharge of the energy reservoir for all discharging cycles during the first time period, the first aging value $a_1$ being calculated using an aging model based on the determined depths of discharge. Because the depth of discharge has a substantial influence on cyclic aging, it is thereby possible to approximate or calculate the first aging value $a_1$, or each aging value $a_i$ for any i-th time period, with particular accuracy.

According to a further refinement the first aging value $a_1$ is calculated based on an average depth of discharge, the average depth of discharge being the average of the depths of discharge of the discharging cycles determined during the first time period. Each aging value $a_i$ for each i-th time period can also correspondingly be determined based on an average depth of discharge as an average of the depths of discharge of the discharging cycles during the i-th time period. The average can be calculated as an equally weighted average.

Different depths of discharge can, however, also be employed with unequal weights for averaging, for example if it is known that a depth of discharge above or below a specific threshold causes a particularly high or low degree of wear on, i.e. aging of, the energy reservoir. A specific depth of discharge that causes particularly severe aging of the energy reservoir can be comparatively more heavily weighted in the average than a specific depth of discharge that causes particularly little aging of the energy reservoir.

According to a further refinement the second time period is a time period that immediately succeeds the first time period in time.

According to a further refinement the method is carried out for each of a plurality of immediately successive time periods constituting a respective second time period, the calculated maximum aging value $A_1$ for the respective immediately preceding time period being defined as the respective first target aging value $a_{targ,1}$ of the first period. The method can thus be carried out in iteratively repeated fashion for a plurality of time periods. For example, the time period respectively regarded in the context of the i-th repetition as a "second time period" can be regarded in the context of the (i+1)-th repetition as a "first time period"; in the context of the (i+1)-th repetition, a time period that immediately follows the "second time period" of the i-th repetition is then regarded as a "second time period" of the (i+1)-th repetition and as a "first time period" of the (i+2)-th repetition, and so on.

According to a further refinement of the method according to the present invention a plurality of further differences $\Delta_i$ is furthermore calculated. Each further i-th difference $\Delta_i$ is a difference between an i-th target aging value $a_{targ,i}$ of the energy reservoir and a respective determined i-th aging value $a_i$ that describes an aging of the energy reservoir during an i-th time period. Calculation of the maximum aging value $A_2$ of the energy reservoir for the second time period can furthermore be based on the calculated further differences $\Delta_i$.

The present invention will be explained in more detail below with reference to the exemplifying embodiments depicted in the schematic Figures of the drawings.

DETAILED DESCRIPTION

Figure 1:
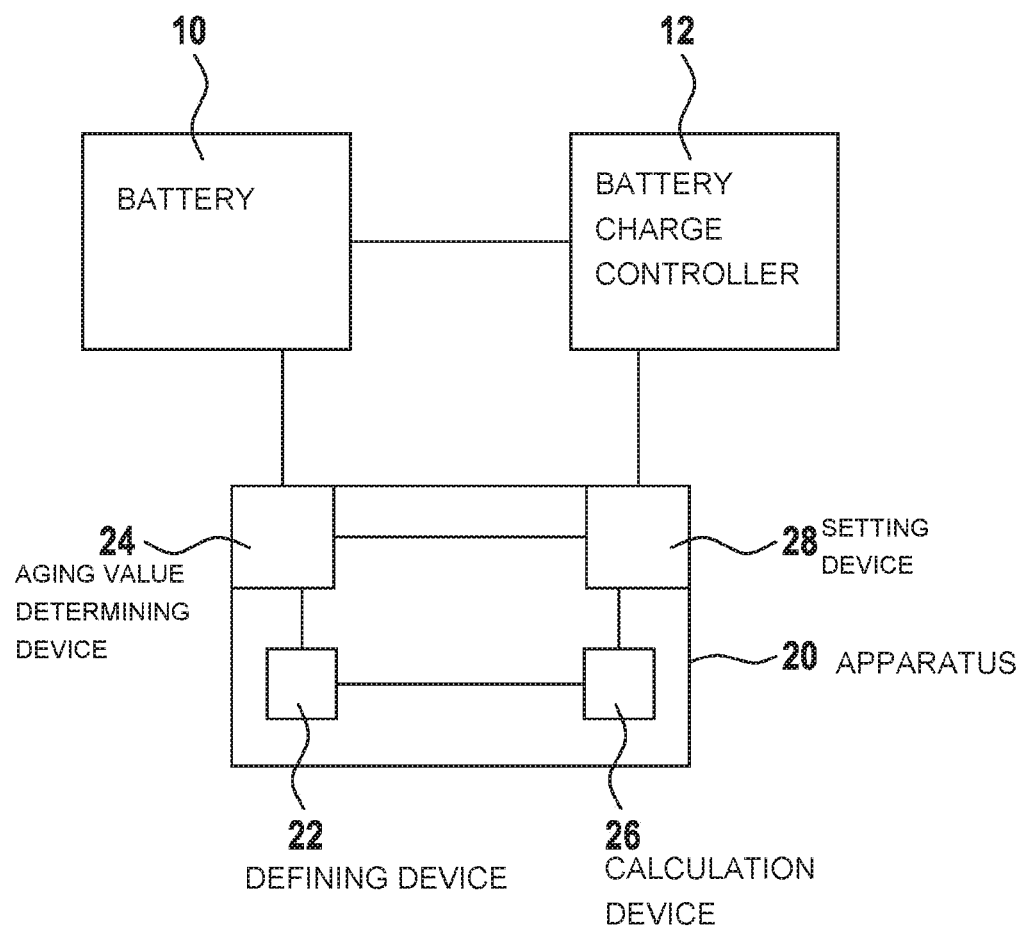
FIG. 1 is a schematic block diagram to explain an apparatus for setting a maximum depth of discharge of an energy reservoir for a time period, in accordance with a first embodiment of the present invention.

FIG. 1 is a schematic block diagram to explain an apparatus for setting a maximum depth of discharge of an energy reservoir for a time period, in accordance with a first embodiment of the present invention.

According to FIG. 1 the apparatus for setting a maximum depth of discharge of an energy reservoir for a time period, in accordance with the first embodiment of the present invention, encompasses a defining device 22, an aging value determining device 24, a calculation device 26, and a setting device 28, which are coupled to one another. At least aging value determining device 24 is coupled to energy reservoir 10. At least setting device 28 is coupled to a battery charge controller 12. Battery charge controller 12 is coupled to energy reservoir and controls/regulates the charging/discharging of energy reservoir 10. Battery charge controller 12 can in particular control the depth of discharge to which energy reservoir is allowed to be discharged in a specific time period. The functions of the elements shown in FIG. 1 will be explained in further detail below with reference to FIG. 2.

Figure 2:
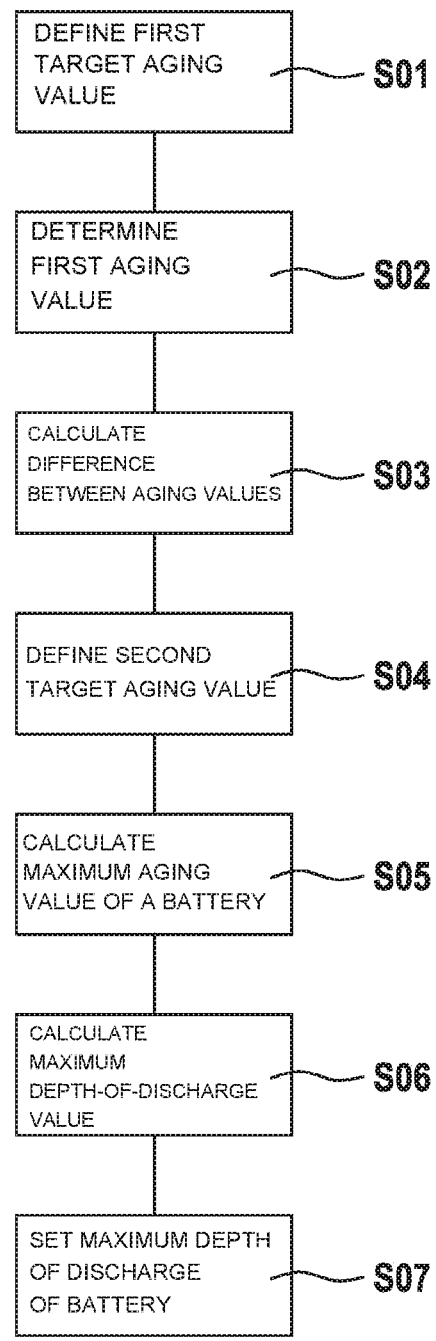
FIG. 2 is a schematic flow chart to explain a method for setting a maximum depth of discharge of an energy reservoir for a time period, in accordance with a second embodiment of the present invention.

FIG. 2 is a schematic flow chart to explain a method for setting a maximum depth of discharge of an energy reservoir for a time period, in accordance with a second embodiment of the present invention.

In a method step S01 a first target aging value $a_{targ,1}$ of energy reservoir 10 for a first time period is defined, for example by way of defining device 22. According to the second exemplifying embodiment, time periods having a duration of one day are assumed. For definition of the first target aging value $a_{targ,1}$, the planned service life of energy reservoir 10 is divided by the duration of the first time period, in this case one day. The reciprocal of the number ascertained is the fraction of the state of health SOH of battery 10 by which the state of health SOH is allowed to decrease as scheduled in each time period, i.e. the first target aging value $a_{targ,1}$. If energy reservoir 10 were therefore to age by an amount equal to the first target aging value $a_{targ,1}$ in every time period of its service life, the state of health SOH of battery 10 would have decreased from 1 at the beginning of the service life to 0 at the end of the service life, corresponding to the formula $SOH=1-\Sigma_i a_{targ,i}$. The second embodiment will be described below assuming a battery 10 as energy reservoir 10.

According to the second embodiment a second-order polynomial is used in the average depth of discharge per time period as an aging model for battery 10, i.e.

$$a_i = c_1 d_i + c_2 d_i^2,$$

where $a_i$ is an i-th aging value of battery 10 during an i-th time period, $d_i$ is an average depth of discharge of battery 10 over several charging and discharging cycles during the i-th time period, and $c_1$, $c_2$ are free parameters that can be defined appropriately. The actual aging state or "state of health" SOH of battery 10 is therefore given by $SOH=1-\Sigma_i a_i$. Instead of a second-order polynomial it is also possible to use higher-order polynomials in order to enable an even more accurate aging model. The coefficients $c_1, c_2, \ldots, c_p$ of the aging model are advantageously determined based on measurements.

Proceeding from this aging model, alternatively the first target aging value $a_{targ,1}$ can also be defined based on a desired average depth of discharge per time period. For example, if on average an average depth of discharge of 60% is advantageous, then e.g.

$$a_{targ,1} = c_1 60 + c_2 60^2$$

can be defined as a first target aging value $a_{targ,1}$.

In a step S02 a first aging value $a_1$, which describes an aging of battery 10 during the first time period, is determined, for example by way of aging value determining device 24. According to the second embodiment, for this purpose all depths of discharge of battery 10 are determined for all discharging cycles during the first time period. From the determined depths of discharge that respectively indicate the discharging of battery 10 with reference to its total capacity, an average depth of discharge during the first time period is calculated by equally weighted averaging. The first aging value $a_1$, which describes the aging of battery 10 during the first time period, can thus be determined by way of the above-described aging model. The model used to determine the first aging value $a_1$• can also, as compared with the model described above, be of the form $$a_i = \gamma(c_1 d_i + c_2 d_i^2),$$

where $\gamma$ is a control parameter between 0 and 1. The control parameter $\gamma$ can adapt the sensitivity of a controller and/or can serve to compensate for any errors in the aging model.

In a step S03 a first difference $\Delta_1$ between the first target aging value $a_{targ,1}$ of battery 10 and the first aging value $\Delta_1$ of battery 10 is calculated, for example by way of calculation device 26. In other words:

$$\Delta_1 = a_{targ,1} - a_1.$$

The first difference $\Delta_1$ describes, so to speak, the "aging credit" if $\Delta_1$ is positive or an "aging debit" if $\Delta_1$ is negative. According to the second embodiment the aging debit or aging credit can be transferred from one time period to a successive time period.

In a method step S04 a second target aging value $a_{targ,2}$ of battery 10 for a second time period is defined, for example by way of defining device 22. According to the second embodiment the second target aging value $a_{targ,2}$ is equal to the first target aging value $a_{targ,1}$, and the second time period is a time period immediately successive to the first time period.

In a step S05 a maximum aging value $A_2$ of battery 10 for the second time period is calculated, for example by way of calculation device 26. This maximum aging value $A_2$ is based on the second target aging value $a_{targ,2}$ and at least the first difference $\Delta_1$. According to the second embodiment the maximum aging value $A_2$ is the sum of the second target aging value $a_{targ,2}$ and the first difference $\Delta_1$, i.e.

$$A_2 = a_{targ,2} + \Delta_1.$$

According to a third embodiment that is substantially analogous to the second embodiment, not only is the first difference $\Delta_1$ between the first target aging value $a_{targ,1}$ and the first aging value $A_1$ of battery 10 determined, but a plurality of further differences $\Delta_i$ between i-th target aging values $a_{targ,i}$ of battery 10 and i-th aging values $A_i$ of battery 10 are determined in the same manner as described above for the first difference $\Delta_1$. Also in accordance with this embodiment, the maximum aging value $A_2$ for the second time period is calculated as a sum of the second target aging value $a_{targ,2}$ and all calculated i-th differences $\Delta_i$ for all time periods that were located before the second time period, i.e. $A_2 = a_{targ,2} + \Sigma_{i=1, i \neq 2}^{n} \Delta_i$, where the n-th time period is the time period immediately preceding the second time period. In general, for the maximum aging value $A_m$ of an m-th time period the following can apply: $A_m = a_{targ,m} + \Sigma_{i=1}^{m=1} \Delta_i$.

In other words, according to this embodiment of the present invention an aging credit or an aging debit is carried over in unlimited fashion from one time period to another. Optionally, a limit can be set such that, for example, only the five respective last aging credits/debits, i.e. differences $\Delta_{i-5}$ to $\Delta_{i-1}$, are employed to determine the maximum aging value $A_i$ for the i-th time period. An absolute limit for the maximum aging value $A_i$ of all time periods can also be defined, in order to eliminate extreme values. The aging credit/debit transferable from each individual time period can also be limited to a limit L, i.e. $\Delta_i \leq L$.

In a method step S06, based on the maximum aging value $A_2$ a maximum depth-of-discharge value $D_2$ for the second time period is calculated, for example by way of calculation device 26. According to the second embodiment the maximum depth-of-discharge value $D_i$ for the i-th time period is calculated utilizing the aging model described above. For this, the calculated maximum aging value $A_i$ is equalized with the formula for the aging value $a_i$ of the i-th time period in accordance with the aging model, and instead of the known average depth of discharge $d_i$ the respective maximum depth-of-discharge value $D_1$ or $D_2$ that is to be determined is used:

$$A_i = c_1 D_i + c_2 D_i^2$$

or $$A_2 = c_1 D_2 + c_2 D_2^2.$$

The resulting equation can then be solved for the maximum depth-of-discharge value $D_i$ for the i-th time period or for the maximum depth-of-discharge value $D_2$ for the second time period. In other words, a single aging model is used both to calculate the actual aging value $a_i$ of the i-th time period and to calculate S05 the maximum aging value $A_{i+1}$ of the (i+1)-th time period.

Alternatively, different aging models can also be used for the two calculations.

In a method step S07 the maximum depth of discharge of battery 10 for the second time period is set to the maximum depth-of-discharge value $D_2$. This can be done, for example, by an apparatus 20 according to the present invention embodied on battery 10 or on battery charge controller 12, in particular by way of setting device 28. In any case, battery 10 can be discharged in the second time period only at most to the maximum depth-of-discharge value $D_2$ that has been set.

Although the present invention has been described in the present case with reference to exemplifying embodiments, it is not limited thereto but is instead modifiable in numerous ways. In particular, the invention can be changed or modified in a multiplicity of ways without deviating from the essence of the invention.

For example, time periods having a period duration other than one day can of course be used. Depending on the utilization and environment of the energy reservoir, the period durations can be, for example, minutes, hours, weeks, months, or others, for example period durations of 3 days.

According to the embodiments described above the time periods were all of equal length. It is also conceivable, however, for the time periods to be determined variably, for example for each time period to encompass a time span in which a single charging cycle and a single discharging cycle of the energy reservoir is carried out. This can be advantageous, for example, if instead of a planned service life of the energy reservoir, a planned number of charging/discharging cycles of the energy reservoir is to be predefined. The method having the variable time periods could execute analogously to one of the embodiments described above; a global constant target aging value $a_{targ}$ for all time periods can be defined by the reciprocal of the predetermined total number of cycles.

An "apparatus" can be understood here as an electrical device that processes sensor signals and, as a function thereof, outputs control signals and/or data signals. The apparatus can have an interface that can be embodied as hardware and/or software. With a hardware embodiment the interfaces can be, for example, part of a so-called system ASIC that contains a wide variety of functions of the apparatus. It is also possible, however, for the interfaces to be separate integrated circuits or to be made up at least partly of discrete components. With a software embodiment the interfaces can be software modules that are present, for example, on a microcontroller alongside other software modules.

What is claimed is:

1. A method for setting a maximum depth of discharge of an energy reservoir for a time period, the method comprising:
    defining a first target aging value of the energy reservoir for a first time period;
    determining a first aging value that describes an actual aging of the energy reservoir during the first time period;
    calculating a first difference between the first target aging value of the energy reservoir and the first aging value of the energy reservoir;
    defining a second target aging value of the energy reservoir for a second time period;
    calculating a maximum aging value of the energy reservoir for the second time period, based on the second target aging value and at least the first difference;
    calculating a maximum depth-of-discharge value based on the maximum aging value;
    setting the maximum depth of discharge of the energy reservoir for the second time period to the maximum depth-of-discharge value; and
    controlling the discharging of the energy reservoir during the second time period to limit the discharging to at most the maximum depth of discharge.

2. The method of claim 1, wherein the first target aging value and the second target aging value are a constant global target aging value.

3. The method of claim 1, wherein the first target aging value and/or the second target aging value is regularly set or modified based on a calendar date.

4. The method of claim 1, the method further comprising:
    determining a respective depth of discharge of the energy reservoir for all discharging cycles during the first time period, wherein the determining of the first aging value includes calculating the first aging value using an aging model based on the determined depths of discharge.

5. The method of claim 4, wherein the first aging value is calculated based on an average depth of discharge, the average depth of discharge being the average of the depths of discharge of the discharging cycles determined during the first time period.

6. The method of claim 1, wherein the second time period immediately succeeds the first time period in time.

7. The method of claim 6, wherein the method is performed for each of a plurality of immediately successive time periods constituting a respective second time period, the respective first target aging value of the first period being the calculated maximum aging value for the respective immediately preceding time period.

8. The method of claim 1, further comprising:
calculating a plurality of further differences that are each between a respective target aging value of the energy reservoir and a respective determined aging value that describes an aging of the energy reservoir during a respective time period, wherein the calculation of the maximum aging value of the energy reservoir for the second time period is further based on the calculated further differences.

9. An apparatus for setting a maximum depth of discharge of an energy reservoir for a time period, comprising:
a defining device for defining a first target aging value of the energy reservoir for a first time period and for defining a second target aging value of the energy reservoir for a second time period;
an aging value determining device for determining a first aging value that describes an actual aging of the energy reservoir during the first time period;
a calculation device for calculating a first difference between the first target aging value of the energy reservoir and the first aging value of the energy reservoir, for calculating a maximum aging value of the energy reservoir for the second time period based on the second target aging value and at least the first difference, and for calculating a maximum depth-of-discharge value based on the maximum aging value;
a setting device for setting the maximum depth of discharge of the energy reservoir for the second time period to the maximum depth-of-discharge value; and
a battery charge control device to limit discharging of the battery during the second time period to at most the maximum depth of discharge.

* * * * *